US012562208B2

(12) United States Patent
Coppola

(10) Patent No.: US 12,562,208 B2
(45) Date of Patent: Feb. 24, 2026

(54) REFRESHING A MEMORY DEVICE USING REAL-TIME CLOCK INFORMATION

(71) Applicant: Micron Technology, Inc., Boise, ID (US)

(72) Inventor: Gianluca Coppola, Liveri (IT)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 18/417,818

(22) Filed: Jan. 19, 2024

(65) Prior Publication Data

US 2024/0249763 A1 Jul. 25, 2024

Related U.S. Application Data

(60) Provisional application No. 63/480,870, filed on Jan. 20, 2023.

(51) Int. Cl.
G11C 11/406 (2006.01)
G11C 29/52 (2006.01)

(52) U.S. Cl.
CPC .. G11C 11/40615 (2013.01); G11C 11/40618 (2013.01); G11C 29/52 (2013.01)

(58) Field of Classification Search
CPC ........ G11C 11/40615; G11C 11/40618; G11C 29/52
USPC .......................................................... 365/222
See application file for complete search history.

(56) References Cited

U.S. PATENT DOCUMENTS

| | | | |
|---|---|---|---|
| 2015/0134897 A1* | 5/2015 | Sriramagiri ....... | G11C 11/40626 711/106 |
| 2020/0174882 A1* | 6/2020 | Kim ......................... | G11C 5/04 |
| 2021/0217465 A1* | 7/2021 | Jung ..................... | G06F 3/0679 |
| 2023/0039381 A1* | 2/2023 | Bueb ................. | G11C 16/0483 |

* cited by examiner

*Primary Examiner* — Huan Hoang
(74) *Attorney, Agent, or Firm* — Harrity & Harrity, LLP

(57) ABSTRACT

In some implementations, a memory device may receive, from a host device, real-time clock information. The memory device may receive, from the host device, an indication of a refresh period. The memory device may determine that the refresh period has expired based on the real-time clock information. The memory device may perform a memory refresh on a memory of the memory device based on the refresh period being expired.

20 Claims, 4 Drawing Sheets

REFRESHING A MEMORY DEVICE USING REAL-TIME CLOCK INFORMATION

CROSS-REFERENCE TO RELATED APPLICATION

This Patent Application claims priority to U.S. Provisional Patent Application No. 63/480,870, filed on Jan. 20, 2023, and entitled "REFRESHING A MEMORY DEVICE USING REAL-TIME CLOCK INFORMATION." The disclosure of the prior Application is considered part of and is incorporated by reference into this Patent Application.

TECHNICAL FIELD

The present disclosure generally relates to memory devices, memory device operations, and, for example, to refreshing a memory device using real-time clock information.

BACKGROUND

A non-volatile memory device, such as a NAND memory device, may use circuitry to enable electrically programming, erasing, and storing of data even when a power source is not supplied. Non-volatile memory devices may be used in various types of electronic devices, such as computers, mobile phones, or automobile computing systems, among other examples.

A non-volatile memory device may include an array of memory cells, a page buffer, and a column decoder. In addition, the non-volatile memory device may include a control logic unit (e.g., a controller), a row decoder, or an address buffer, among other examples. The memory cell array may include memory cell strings connected to bit lines, which are extended in a column direction.

A memory cell, which may be referred to as a "cell" or a "data cell," of a non-volatile memory device may include a current path formed between a source and a drain on a semiconductor substrate. The memory cell may further include a floating gate and a control gate formed between insulating layers on the semiconductor substrate. A programming operation (sometimes called a write operation) of the memory cell is generally accomplished by grounding the source and the drain areas of the memory cell and the semiconductor substrate of a bulk area, and applying a high positive voltage, which may be referred to as a "program voltage," a "programming power voltage," or "PPV," to a control gate to generate Fowler-Nordheim tunneling (referred to as "F-N tunneling") between a floating gate and the semiconductor substrate. When F-N tunneling is occurring, electrons of the bulk area are accumulated on the floating gate by an electric field of VPP applied to the control gate to increase a threshold voltage of the memory cell.

An erasing operation of the memory cell is concurrently performed in units of sectors sharing the bulk area (referred to as "blocks"), by applying a high negative voltage, which may be referred to as an "erase voltage" or "$V_{era}$," to the control gate and a configured voltage to the bulk area to generate the F-N tunneling. In this case, electrons accumulated on the floating gate are discharged into the source area, so that the memory cells have an erasing threshold voltage distribution.

Each memory cell string may have a plurality of floating gate type memory cells serially connected to each other. Access lines (sometimes called "word lines") are extended in a row direction, and a control gate of each memory cell is connected to a corresponding access line. A non-volatile memory device may include a plurality of page buffers connected between the bit lines and the column decoder. The column decoder is connected between the page buffer and data lines.

DETAILED DESCRIPTION

Figure 1:
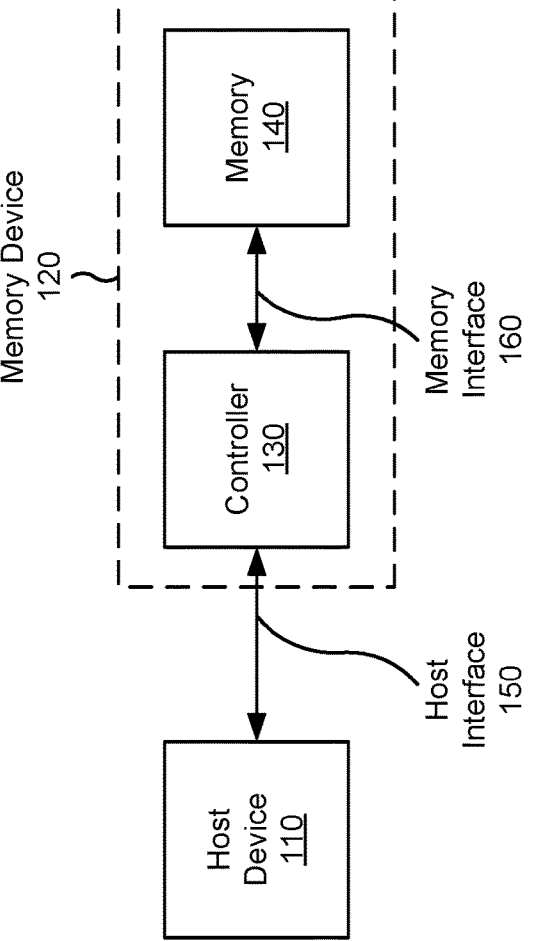
FIG. 1 is a diagram illustrating an example system capable of refreshing a memory device using real-time clock information.

A memory device, such as a managed NAND (mNAND) device, may implement a memory refresh, which may involve a refresh of data stored in a memory of the memory device. During the memory refresh, data may be read from the memory and then rewritten to the memory. For example, the data may be read from one region of the memory, and then the data may be written to the same region of the memory, or the data may be rewritten to a different region of the memory. During the memory refresh, the data may not be modified prior to being rewritten to the memory. An mNAND data storage may require the memory refresh, particularly for automotive applications for which data retention is especially important.

A memory device may implement an event-based memory refresh mechanism.

The memory device may detect an occurrence of an event, such as an error correcting code (ECC) count that satisfies a threshold, a memory cell distribution that satisfies some criteria, and/or a memory cell status that satisfies some criteria. The memory device may perform the memory refresh based on the occurrence of the event. For example, the memory device may implement a firmware scan/refresh algorithm that scans the memory device, and then eventually performs the memory refresh based on the ECC count, the memory cell distribution, and/or the memory cell status. However, in the event-based memory refresh approach, data stored in the memory device may potentially not be refreshed for relatively long periods of time, when certain events do not occur for the relatively long periods of time.

In order to avoid data stored in the memory device not being refreshed for relatively long periods of time, original equipment manufacturers (OEMs) have requested that data stored in the memory device be refreshed in a certain absolute time (e.g., every six months). To satisfy this request, a host device may periodically refresh the data stored in the memory device depending on application requirements. The host device may periodically refresh the data stored in the memory device, which may be in addition to the firmware scan/refresh algorithm. In other words, host software may be used to perform the action of periodically refreshing the data stored in the memory device based on the application requirements (e.g., a periodic refresh every six months). As an example, in a universal flash storage (UFS) Joint Electron Device Engineering Council (JEDEC) specification, a refresh frequency (bRefreshFreq) parameter may be defined, but the host device may need to ensure that the memory device performs the memory refresh according to that refresh frequency. Such an approach involves increased overhead at the host device side, as well as implies a customization of the host software, which further creates complexity at the host device side.

In some implementations, a memory device, such as an mNAND device, may receive, from a host device, real-time clock information. The real-time clock information may include absolute time information. The memory device may receive, from the host device, an indication of a refresh period (e.g., six months). For example, the host device may set a register of the memory device with the indication of the refresh period. The memory device may determine, based on the real-time clock information, that the refresh period has expired. In other words, based on the real-time clock information, the memory device may track when the refresh period has finished. The memory device may refresh the memory based on the refresh period being expired. In other words, the memory device may perform a memory refresh based on the refresh period being expired, where the memory refresh may involve reading data from the memory and rewriting the data to the memory. The memory device may be able to refresh the memory based on the refresh period being expired irrespective of an ECC count, a memory cell distribution, and/or a memory cell status. The memory device may be associated with an automotive application, where data retention with reduced host device overhead may be especially important.

In some implementations, the memory device may perform the memory refresh using mNAND firmware. The memory device may implement a data retention refresh based on the real-time clock information. The host device may provide the real-time clock information, which may include the absolute time information, to the memory device using a real-time clock protocol. The host device may set the register of the memory device (e.g., an mNAND register) in order to define the refresh period (e.g., six months). The memory device may automatically ensure that data stored on the memory device is refreshed according to the refresh period (e.g., every six months of absolute time), regardless of a NAND cell status or ECC counts. In some implementations, the memory device may notify the host device when the memory device is not able to complete the memory refresh. The memory device may set a flag until the memory refresh is successfully completed.

In some implementations, the memory device may perform the memory refresh based on the refresh period, where the refresh period may correspond to an absolute time defined by the host device (e.g., the refresh period may be a host device setting). As a result, the memory device may be ensured to be refreshed in a certain absolute time based on the mNAND firmware running on the memory device. The host device may only provide the refresh period, which may correspond to a timeline, and the memory device may trigger the memory refresh on time, which may avoid or reduce host software overhead to periodically refresh the memory device. By using the real-time clock information and the refresh period, the memory device may automatically perform the memory refresh without causing additional overhead to the host device, thereby improving a performance of both the memory device and the host device.

FIG. 1 is a diagram illustrating an example system 100 capable of refreshing a memory device using real-time clock information. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device or apparatus configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include control logic, a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a UFS interface, and/or an eMMC interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, one or more systems, devices, apparatuses, components, and/or controllers of FIG. 1 may be configured to receive, from the host device 110, real-time clock information; receive, from the host device 110, an indication of a refresh period; determine that the refresh period has expired based on the real-time clock information; and refresh the memory 140 of the memory device 120 based on the refresh period being expired.

In some implementations, one or more systems, devices, apparatuses, components, and/or controllers of FIG. 1 may be configured to receive real-time clock information; receive an indication of a refresh period; determine that the refresh period has expired based on the real-time clock information; and perform a memory refresh on the memory 140 of the memory device 120 based on the refresh period being expired.

As indicated above, FIG. 1 is provided as an example. Other examples may differ from what is described with regard to FIG. 1.

Figure 2:
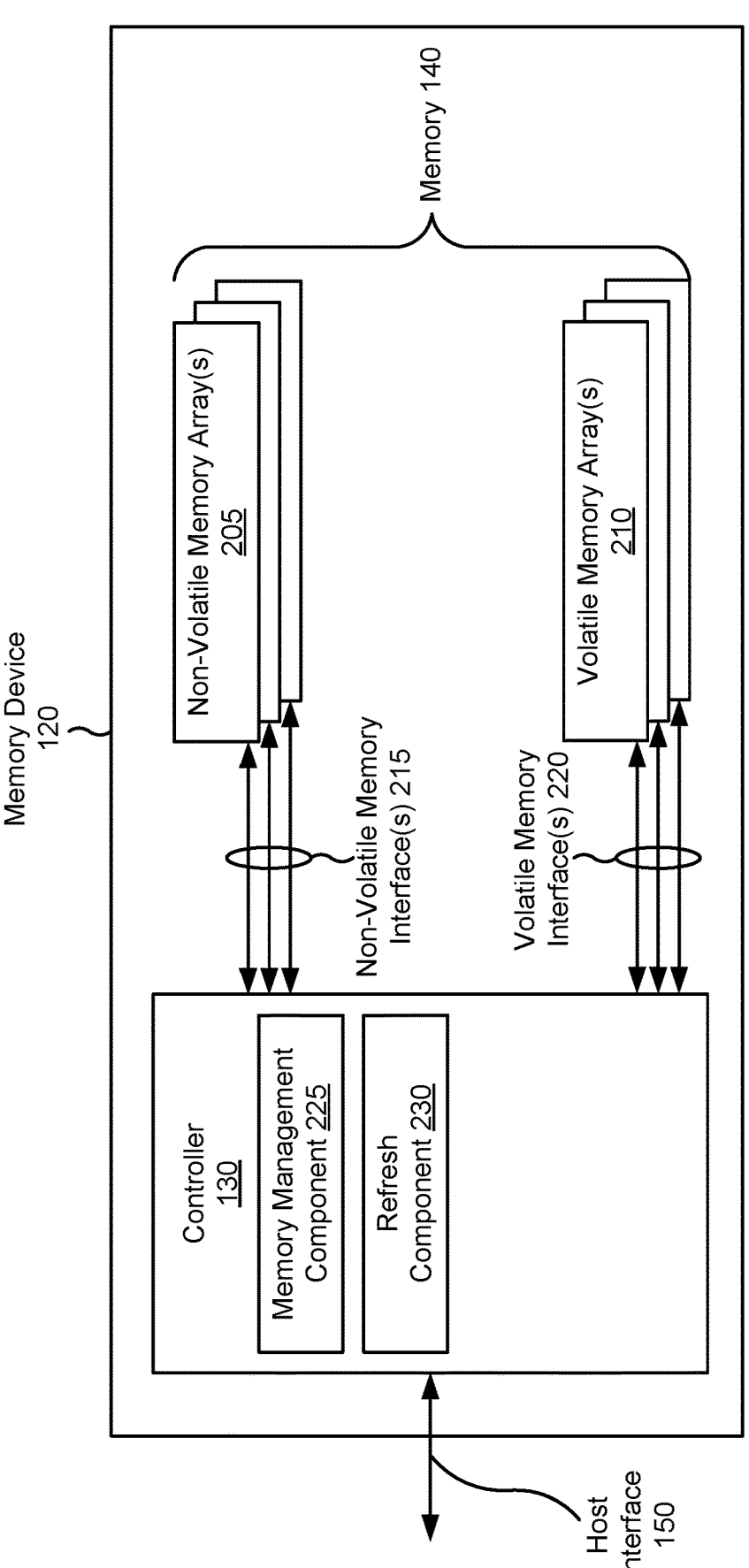
FIG. 2 is a diagram of example components included in a memory device.

FIG. 2 is a diagram of example components included in a memory device 120. As described above in connection with FIG. 1, the memory device 120 may include a controller 130 and memory 140. As shown in FIG. 2, the memory 140 may include one or more non-volatile memory arrays 205, such as one or more NAND memory arrays and/or one or more NOR memory arrays. Additionally, or alternatively, the memory 140 may include one or more volatile memory arrays 210, such as one or more SRAM arrays and/or one or more DRAM arrays. The controller 130 may transmit signals to and receive signals from a non-volatile memory array 205 using a non-volatile memory interface 215. The controller 130 may transmit signals to and receive signals from a volatile memory array 210 using a volatile memory interface 220.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 225, and/or a refresh component 230. In some implementations, one or more of these components are implemented as one or more instructions (e.g., firmware) executed by the controller 130. Alternatively, one or more of these components may be implemented as dedicated integrated circuits distinct from the controller 130.

The memory management component 225 may be configured to manage performance of the memory device 120. For example, the memory management component 225 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 225, such as information regarding memory block age, memory block erase count, and/or error information associated with a memory partition (e.g., a memory cell, a row of memory, a block of memory, or the like).

The refresh component 230 may be configured to receive, from the host device 110, real-time clock information. The refresh component 230 may be configured to receive, from the host device 110, an indication of a refresh period. The refresh component 230 may be configured to determine that the refresh period has expired based on the real-time clock information. The refresh component 230 may be configured to refresh the memory 140 based on the refresh period being expired.

One or more devices or components shown in FIG. 2 may be configured to perform operations described herein, such as one or more operations and/or methods described in connection with FIGS. 3-4. For example, the controller 130, the memory management component 225, and/or the refresh component 230 may be configured to perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 mayperform one or more operations described as being performed by another set of components shown in FIG. 2.

Figure 3:
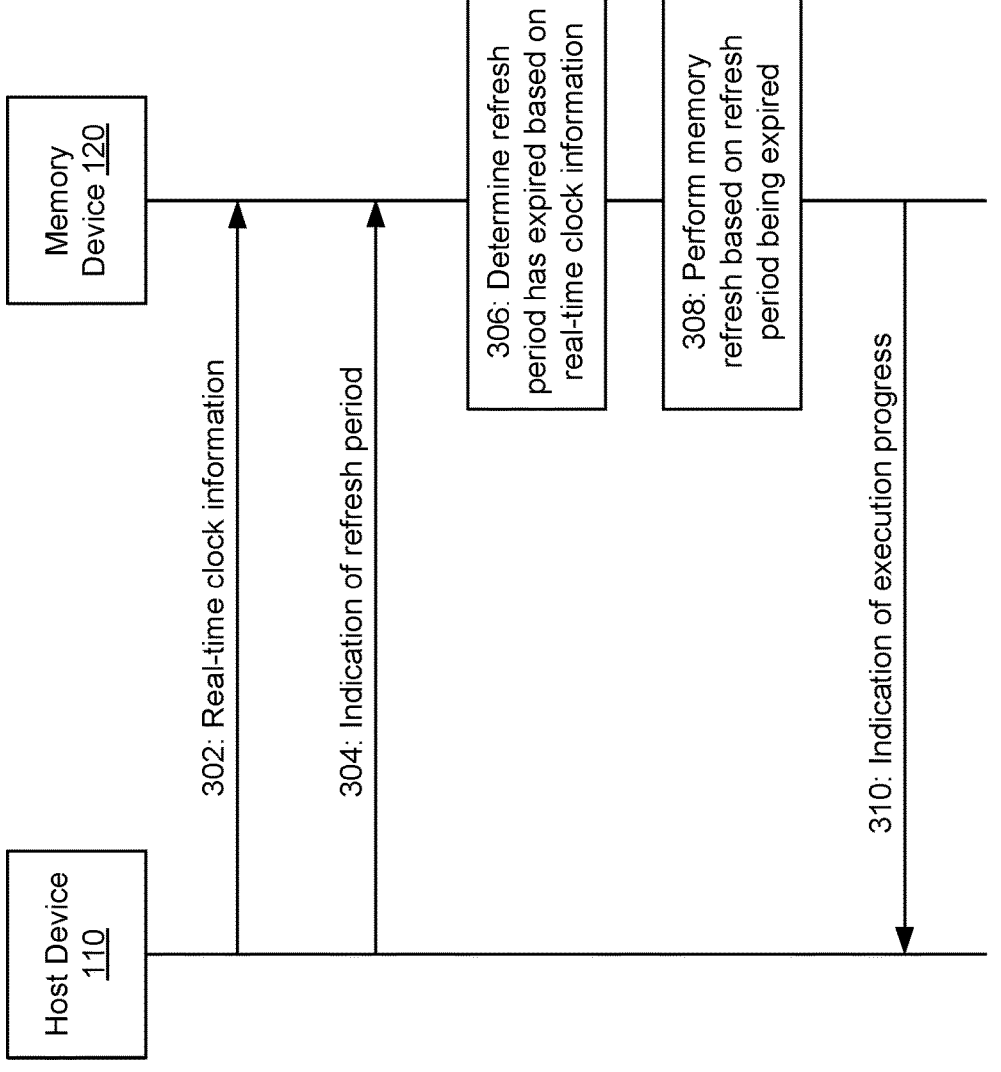
FIG. 3 is a diagram illustrating an example associated with refreshing a memory device using real-time clock information.

FIG. 3 is a diagram of an example 300 of refreshing a memory device using real-time clock information. The operations described in connection with FIG. 3 may be performed by the memory device 120 and/or one or more components of the memory device 120, such as the controller 130 and/or one or more components of the controller 130, and/or the operations described in connection with FIG. 3 may be performed by the host device 110.

In some implementations, the memory device 120 may be a non-volatile memory device, such as an mNAND device or a UFS device. The memory device 120 may be a memory card. In some implementations, the memory device 120 may be associated with an automotive application. In some implementations, the memory device 120 may run mNAND firmware, which may be responsible for refreshing the memory device 120 using the real-time clock information.

As shown by reference number 302, the memory device 120 may receive, from the host device 110, real-time clock information. The real-time clock information may include absolute time information. The host device 110 may provide the real-time clock information to the memory device 120, which may be useful for the memory device 120 in performing various internal maintenance operations. The host device 110 may provide the absolute time information, if available, or the host device 110 may provide relative time information. The host device 110 may send the real-time clock information to update the memory device 120 with either an absolute time or a relative time. The host device 110 may send the real-time clock information when a periodic real-time clock update (wPeriodicRTCUpdate) time period has passed since a last real-time clock information update. The host device 110 may update the real-time clock information by writing the absolute time or the relative time to a seconds passed (dSecondsPassed) attribute. The memory device 120 may be able to perform operations in the background as a result of receiving the real-time clock update from the host device 110. In some cases, the host device 110 may update the real-time clock information at times during which a system is idle and has no specific power limitations (e.g., at nighttime when a battery of the system is being charged).

As shown by reference number 304, the memory device 120 may receive, from the host device 110, an indication of a refresh period. The refresh period may define an absolute amount of time (e.g., three months), after which the memory device 120 should perform a memory refresh. The memory refresh may involve the memory device 120 reading data from memory (e.g., memory 140) and then rewriting the data to the memory. The memory refresh may be critical for data retention, and should be performed periodically by the memory device 120. When the memory refresh is not performed for a relatively long period of time, some data stored on the memory may not be retained. The refresh period may be defined by the host device 110, and then indicated by the host device 110 to the memory device 120. The refresh period may be set depending on various characteristics or use cases of the memory device 120, and/or based on a requirement of an OEM of the memory device 120.

In some implementations, the indication of the refresh period may be stored in a first register of the memory device 120. The memory device 120 may store the indication of the refresh period in the first register, which may be associated with the memory device 120. The first register may be a first mNAND register. The host device 110 may set the first register to define the refresh period. As an example, the first register may store a first value (e.g., 00 h) to indicate when the refresh period is not enabled at the host device 110, or when the refresh period is still not configured by the host device 110. The first register may store a second value (e.g., 01 h) to indicate a first time period (e.g., one month). The first register may store a third value (e.g., 02 h) to indicate a second time period (e.g., two months). The first register may store a fourth value (e.g., 03 h) to indicate a third time period (e.g., three months). The first register may store additional values to indicate additional time periods.

As shown by reference number 306, the memory device 120 may determine, via the mNAND firmware associated with the memory device 120, that the refresh period has expired based on the real-time clock information. For example, the memory device 120 may periodically receive the real-time clock information from the host device 110, which may allow the memory device 120 to calculate how much time has passed. The memory device 120 may be able to calculate how much time has passed based on multiple real-time clock information updates received from the host device 110. The memory device 120 may also determine the refresh period, which may be stored in the first register of the memory device 120. Based on the refresh period and the calculation of how much time is passing (e.g., using the real-time clock information), the memory device 120 may be able to determine when the refresh period has expired or when the refresh period is about to expire.

As shown by reference number 308, the memory device 120 may refresh the memory based on the refresh period being expired. Alternatively, the memory device 120 may refresh the memory based on the refresh period being about to expire. For example, when the refresh period is three months, the memory device 120 may refresh the memory approximately two seconds before the three months has passed. The memory refresh may involve a refresh of data stored in the memory. During the memory refresh, data may be read from the memory and then rewritten to the memory. For example, the data may be read from one region of the memory, and then the data may be written to the same region of the memory, or the data may be rewritten to a different region of the memory. During the memory refresh, the data may not be modified prior to being rewritten to the memory. Thus, the host device 110 may set the refresh period, and based on the real-time clock information, the memory device 120 may ensure that the memory device 120 is refreshed within the refresh period (or just after the refresh period) specified by the host device 110. For example, based on real-time clock information updates and a refresh period set to six months, the memory device 120 may independently perform the memory refresh every six months, without being instructed by the host device 110 to perform the memory refresh.

In some implementations, the memory device 120 may refresh the memory based on the refresh period being expired, irrespective of a memory cell status, an ECC count, and/or a memory cell distribution. In other words, the memory device 120 may refresh the memory based on an absolute time, which may be in addition to or as an alternative to an event-based memory refresh. For example, the memory device 120 may only refresh the memory in accordance with the absolute time. Alternatively, the memory device 120 may refresh the memory when either an absolute time has passed or a predefined event occurs. As a result, the memory device 120 may be ensured to be refreshed in at least a certain amount of time, which may be important for data retention, especially when the memory device 120 is associated with the automotive application.

As shown by reference number 310, the memory device 120 may report, to the host device 110, an indication of an execution progress. The execution progress may be associated with a status of the memory refresh. The indication may indicate a first value (e.g., 01 h) that indicates that the memory refresh is in progress and the refresh period has not expired. The indication may indicate a second value (e.g., 02 h) that indicates that the memory refresh is in progress and the refresh period has expired. The indication may indicate a third value (e.g., 03 h) that indicates that the memory refresh has not started and the refresh period has not expired. The indication may indicate a fourth value (e.g., 04 h) that indicates that the memory refresh has not started and the refresh period has expired. Alternatively, the indication may indicate a fifth value (e.g., 00 h) that indicates when an execution progress feature is not enabled at the host device 110, or when the execution progress feature is still not configured by the host device 110. The indication of the execution progress may be stored in a second register (e.g., a second mNAND register) of the memory device 120.

In some implementations, the memory device 120 may notify the host device 110 when the memory device 120 is not able to complete the memory refresh in time (e.g., long parking). The memory device 120 may notify the host device 110 via the second register, which may be associated with the memory device 120. For example, the memory device 120 may set the second register with the indication of the execution progress, which may allow the host device 110 to be notified of the execution progress related to the memory refresh. In this case, the second register may be able to store an exception event associated with the memory refresh not being completed in time. A flag in the second register may be set until the memory refresh is successfully completed, or the flag in the second register may be set while the memory refresh is not successfully completed.

In some implementations, an indication of whether the memory refresh based on the real-time clock information is enabled for the memory device 120 is stored in a third register of the memory device 120. The host device 110 may enable a feature associated with an ability to perform the memory refresh using the real-time clock information. The indication may indicate a first value (e.g., 00 h) that indicates that the feature is disabled (e.g., a default setting). The indication may indicate a second value (e.g., 01 h) that indicates that the feature is enabled.

In some implementations, by using the real-time clock information and the refresh period, the memory device 120 may automatically perform the memory refresh without causing additional overhead to the host device 110, thereby improving a performance of both the memory device 120 and the host device 110. The usage of the real-time clock information along with the refresh period, which may be defined and adjustable by the host device 110, may ensure that the memory device 120 is refreshed in a certain absolute time without relying on a certain event which may or may not occur. The refresh period may be a host device setting. The host device 110 may provide a timeline for the memory refresh, via the refresh period, and the memory device 120 may automatically refresh the memory on time, which may reduce a host device software overhead that would otherwise need to periodically refresh the memory device 120.

As indicated above, FIG. 3 is provided as an example. Other examples may differ from what is described with regard to FIG. 3.

Figure 4:
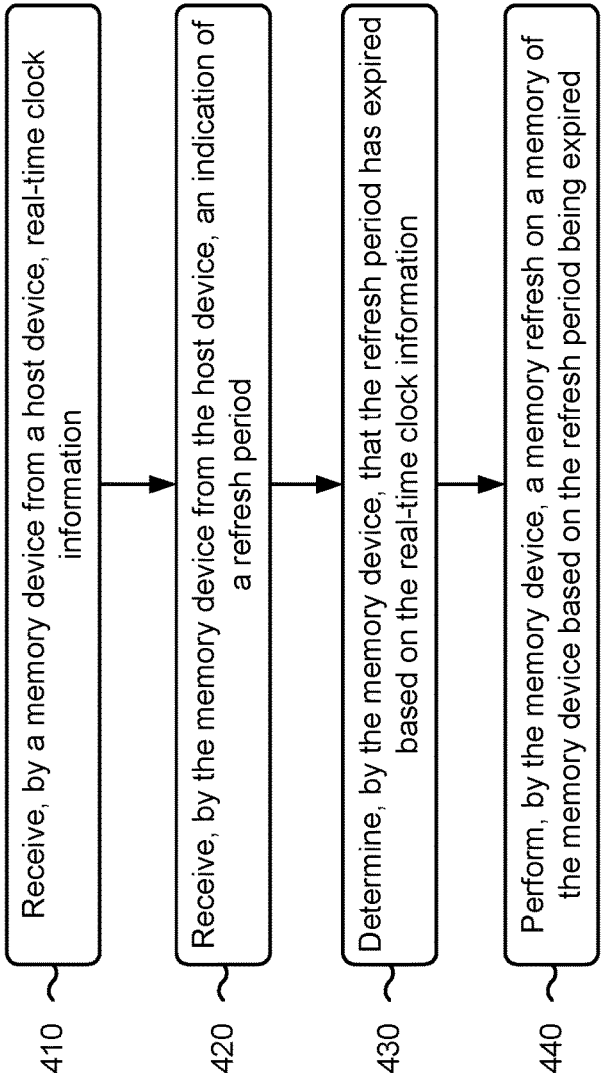
FIG. 4 is a flowchart of an example method associated with refreshing a memory device using real-time clock information.

FIG. 4 is a flowchart of an example method 400 associated with refreshing a memory device using real-time clock information. In some implementations, a memory device (e.g., the memory device 120) may perform or may be configured to perform the method 400. In some implementations, another device or a group of devices separate from or including the memory device (e.g., the system 100) may perform or may be configured to perform the method 400. Additionally, or alternatively, one or more components of the memory device (e.g., the controller 130, the memory management component 225, and/or refresh component 230) may perform or may be configured to perform the method 400. Thus, means for performing the method 400 may include the memory device and/or one or more components of the memory device. Additionally, or alternatively, a non-transitory computer-readable medium may store one or more instructions that, when executed by the memory device (e.g., the controller 130 of the memory device 120), cause the memory device to perform the method 400.

As shown in FIG. 4, the method 400 may include receiving real-time clock information (block 410). As further shown in FIG. 4, the method 400 may include receiving an indication of a refresh period (block 420). As further shown in FIG. 4, the method 400 may include determining that the refresh period has expired based on the real-time clock information (block 430). As further shown in FIG. 4, the method 400 may include performing a memory refresh on a memory of the memory device based on the refresh period being expired (block 440).

The method 400 may include additional aspects, such as any single aspect or any combination of aspects described below and/or described in connection with one or more other methods or operations described elsewhere herein.

In a first aspect, the indication of the refresh period is stored in a first register of the memory device.

In a second aspect, alone or in combination with the first aspect, the method 400 includes performing, by the memory device, the memory refresh based on the refresh period being expired irrespective of one or more of a memory cell status, an ECC count, or a memory cell distribution.

In a third aspect, alone or in combination with one or more of the first and second aspects, the method 400 includes reporting, by the memory device to the host device, an indication of an execution progress, wherein the indication is one of a first value that indicates that the memory refresh is in progress and the refresh period has not expired, a second value that indicates that the memory refresh is in progress and the refresh period has expired, a third value that indicates that the memory refresh has not started and the refresh period has not expired, or a fourth value that indicates that the memory refresh has not started and the refresh period has expired, wherein the indication of the execution progress is stored in a second register of the memory device.

In a fourth aspect, alone or in combination with one or more of the first through third aspects, an indication of whether a memory refresh based on the real-time clock information is enabled for the memory device is stored in a third register of the memory device.

In a fifth aspect, alone or in combination with one or more of the first through fourth aspects, the real-time clock information includes absolute time information.

In a sixth aspect, alone or in combination with one or more of the first through fifth aspects, the memory device is associated with an automotive application.

In a seventh aspect, alone or in combination with one or more of the first through sixth aspects, the memory device is an mNAND device.

Although FIG. 4 shows example blocks of a method 400, in some implementations, the method 400 may include additional blocks, fewer blocks, different blocks, or differently arranged blocks than those depicted in FIG. 4. Additionally, or alternatively, two or more of the blocks of the method 400 may be performed in parallel. The method 400 is an example of one method that may be performed by one or more devices described herein. These one or more devices may perform or may be configured to perform one or more other methods based on operations described herein.

In some implementations, a memory device includes memory; and a controller configured to: receive, from a host device, real-time clock information; receive, from the host device, an indication of a refresh period; determine that the refresh period has expired based on the real-time clock information; and refresh the memory based on the refresh period being expired.

In some implementations, a method includes receiving, by a memory device from a host device, real-time clock information; receiving, by the memory device from the host device, an indication of a refresh period; determining, by the memory device, that the refresh period has expired based on the real-time clock information; and performing, by the memory device, a memory refresh on a memory of the memory device based on the refresh period being expired.

In some implementations, a system includes a host device configured to: provide real-time clock information; and provide an indication of a refresh period, wherein the refresh period is defined by the host device; and a memory device configured to: receive, from the host device, the real-time clock information; receive, from the host device, the indication of a refresh period; determine that the refresh period has expired based on the real-time clock information; and refresh a memory of the memory device based on the refresh period being expired.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, "satisfying a threshold" maydepending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b +b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
memory; and
a controller configured to:
    receive, from a host device, real-time clock information;
    receive, from the host device, an indication of a refresh period;
    determine that the refresh period has expired based on the real-time clock information;
    refresh the memory based on the refresh period being expired; and
    report, to the host device, an indication of an execution progress, wherein the indication is one of:
        a first value that indicates a memory refresh is in progress and the refresh period has not expired,
        a second value that indicates that the memory refresh is in progress and the refresh period has expired,
        a third value that indicates that the memory refresh has not started and the refresh period has not expired, or
        a fourth value that indicates that the memory refresh has not started and the refresh period has expired.

2. The memory device of claim 1, wherein the indication of the refresh period is stored in a first register of the memory device.

3. The memory device of claim 1, wherein the controller is configured to refresh the memory based on the refresh period being expired irrespective of one or more of: a memory cell status, an error correcting code (ECC) count, or a memory cell distribution.

4. The memory device of claim 1,
wherein the indication of the execution progress is stored in a second register of the memory device.

5. The memory device of claim 1, wherein an indication of whether a memory refresh based on the real-time clock information is enabled for the memory device is stored in a third register of the memory device.

6. The memory device of claim 1, wherein the real-time clock information includes absolute time information.

7. The memory device of claim 1, wherein the memory device is associated with an automotive application.

8. The memory device of claim 1, wherein the memory device is a managed NAND (mNAND) device.

9. A method, comprising:

receiving, by a memory device from a host device, real-time clock information;

receiving, by the memory device from the host device, an indication of a refresh period;

determining, by the memory device, that the refresh period has expired based on the real-time clock information;

performing, by the memory device, a memory refresh on a memory of the memory device based on the refresh period being expired; and reporting, to the host device, an indication of an execution progress, wherein the indication is one of:

a first value that indicates a memory refresh is in progress and the refresh period has not expired, a second value that indicates that the memory refresh is in progress and the refresh period has expired, a third value that indicates that the memory refresh has not started and the refresh period has not expired, or a fourth value that indicates that the memory refresh has not started and the refresh period has expired.

10. The method of claim 9, wherein the indication of the refresh period is stored in a first register of the memory device.

11. The method of claim 9, further comprising:

performing, by the memory device, the memory refresh based on the refresh period being expired irrespective of one or more of: a memory cell status, an error correcting code (ECC) count, or a memory cell distribution.

12. The method of claim 9, wherein the indication of the execution progress is stored in a second register of the memory device.

13. The method of claim 9, wherein an indication of whether a memory refresh based on the real-time clock information is enabled for the memory device is stored in a third register of the memory device.

14. The method of claim 9, wherein the real-time clock information includes absolute time information.

15. The method of claim 9, wherein the memory device is associated with an automotive application.

16. A system, comprising:

a host device configured to:

provide real-time clock information; and provide an indication of a refresh period, wherein the refresh period is defined by the host device; and a memory device configured to:

receive, from the host device, the real-time clock information;

receive, from the host device, the indication of a refresh period;

determine that the refresh period has expired based on the real-time clock information;

refresh a memory of the memory device based on the refresh period being expired; and report, to the host device, an indication of an execution progress, wherein the indication is one of:

a first value that indicates a memory refresh is in progress and the refresh period has not expired, a second value that indicates that the memory refresh is in progress and the refresh period has expired, a third value that indicates that the memory refresh has not started and the refresh period has not expired, or a fourth value that indicates that the memory refresh has not started and the refresh period has expired.

17. The system of claim 16, wherein the host device is configured to set a first register of the memory device with the refresh period.

18. The system of claim 16, wherein the memory device is configured to refresh the memory based on the refresh period being expired irrespective of one or more of: a memory cell status, an error correcting code (ECC) count, or a memory cell distribution.

19. The system of claim 16, wherein the indication of the execution progress is stored in a second register of the memory device.

20. The system of claim 16, wherein an indication of whether a memory refresh based on the real-time clock information is enabled for the memory device is stored in a third register of the memory device.

* * * * *